(12) United States Patent
Albertini et al.

(10) Patent No.: US 6,388,846 B1
(45) Date of Patent: May 14, 2002

(54) MAGNETIC FIELD SENSOR WITH MAGNETORESISTOR

(75) Inventors: Jean-Baptise Albertini; Marc Aid, both of Grenoble (FR)

(73) Assignee: Commissariat a l'Energie Atomique, Paris (FR)

(*) Notice: Subject to any disclaimer, the term of this patent is extended or adjusted under 35 U.S.C. 154(b) by 0 days.

(21) Appl. No.: 09/402,248
(22) PCT Filed: Mar. 31, 1998
(86) PCT No.: PCT/FR98/00648
  § 371 Date: Mar. 14, 2000
  § 102(e) Date: Mar. 14, 2000
(87) PCT Pub. No.: WO98/44359
  PCT Pub. Date: Oct. 8, 1998

(30) Foreign Application Priority Data

Apr. 1, 1997 (FR) ............................................. 97 03943

(51) Int. Cl.⁷ .......................... G11B 5/127; G11B 5/39; G01R 33/09
(52) U.S. Cl. ...................... 360/318.1; 360/321; 360/126
(58) Field of Search .................. 360/121, 125, 360/126, 318.1, 321; 338/32 R; 324/252

(56) References Cited

U.S. PATENT DOCUMENTS

| | | | | |
|---|---|---|---|---|
| 4,388,662 A | * | 6/1983 | Jeffers et al. | 360/113 |
| 5,274,521 A | * | 12/1993 | Miyauchi et al. | 360/119 |
| 5,434,733 A | * | 7/1995 | Hesterman et al. | 360/113 |
| 5,436,779 A | * | 7/1995 | Valstyn | 360/113 |
| 5,469,317 A | * | 11/1995 | Nagata et al. | 360/113 |
| 5,648,884 A | * | 7/1997 | Lazzari | 360/113 |
| 5,764,448 A | * | 6/1998 | Lazzari et al. | 360/113 |
| 5,768,070 A | * | 6/1998 | Krounbi et al. | 360/113 |
| 5,798,895 A | * | 8/1998 | Vieux-Rochaz et al. | 360/113 |
| 5,910,869 A | * | 6/1999 | Fedeli | 360/113 |
| 5,936,402 A | * | 8/1999 | Schep et al. | 324/252 |

FOREIGN PATENT DOCUMENTS

| | | | |
|---|---|---|---|
| EP | 0 801 381 | * | 10/1997 |
| JP | 63-138515 | * | 6/1988 |
| JP | 63-138516 | * | 6/1988 |

* cited by examiner

*Primary Examiner*—William Klimowicz
(74) *Attorney, Agent, or Firm*—Burns, Doane Swecker & Mathis LLP

(57) ABSTRACT

According to the invention, the magnetoresistance (25) is coupled to a secondary air gap (15) formed by two hollowed out magnetic parts (12-1, 12-2). Applicable to the measurement of magnetic fields.

13 Claims, 5 Drawing Sheets

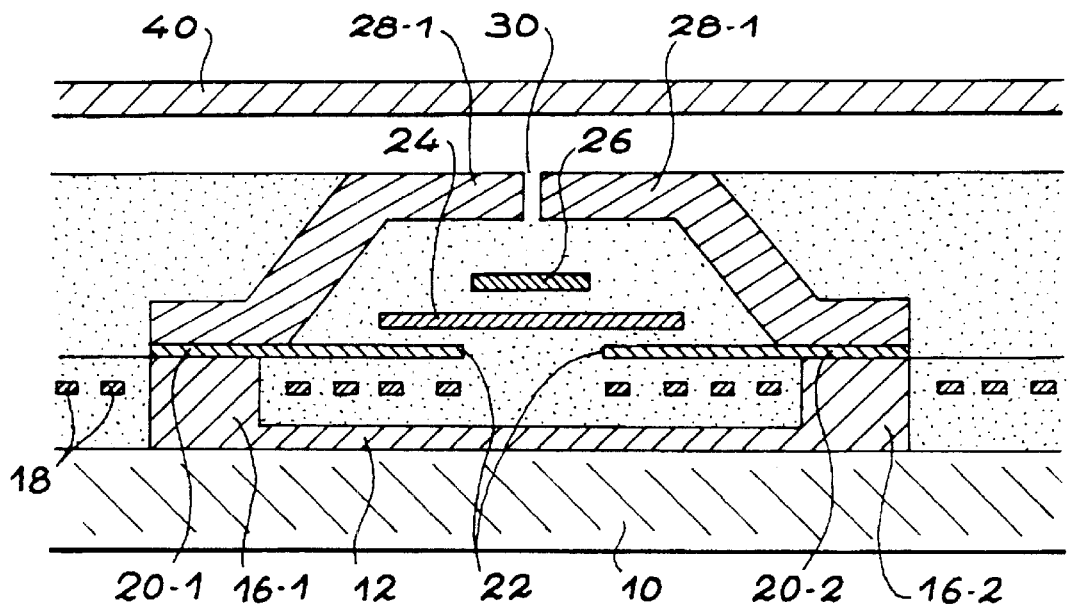
FIG._1
(PRIOR ART)
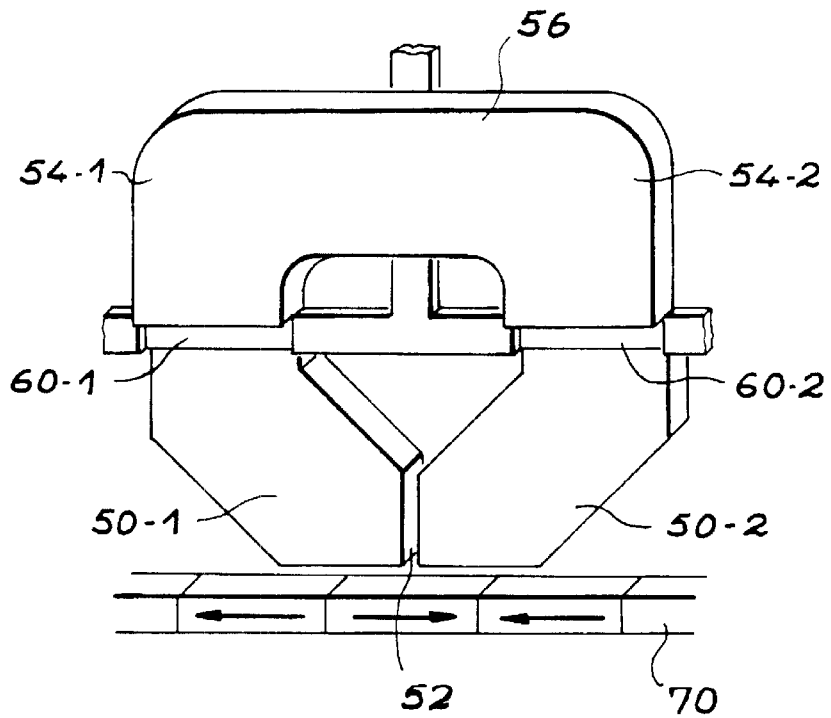
FIG._2
(PRIOR ART)

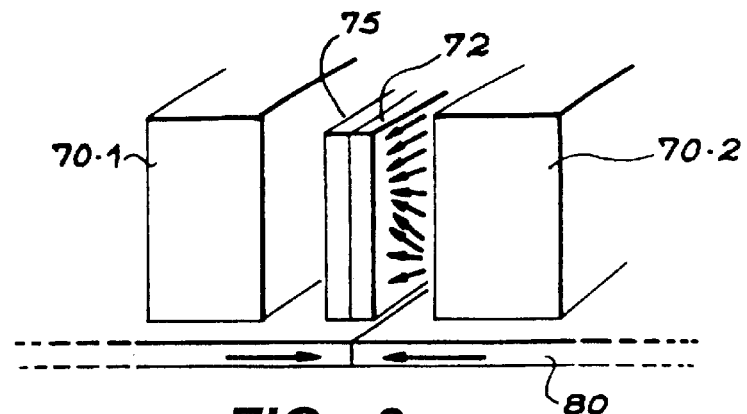
FIG._3
*(PRIOR ART)*
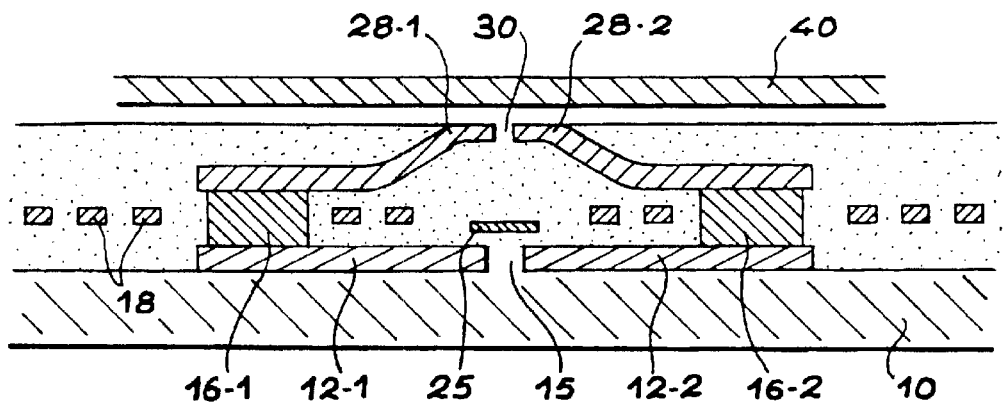
FIG._4
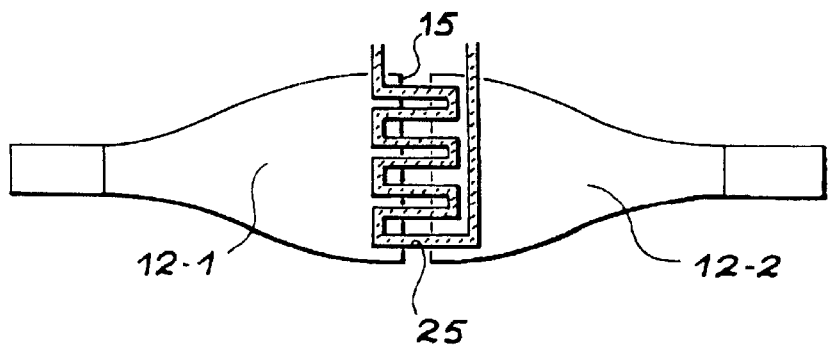
FIG._5

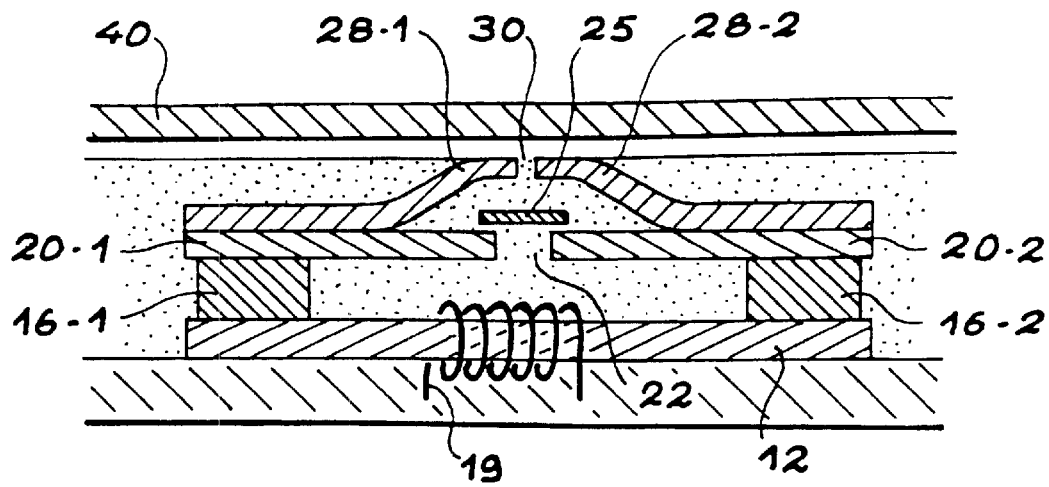
FIG._6
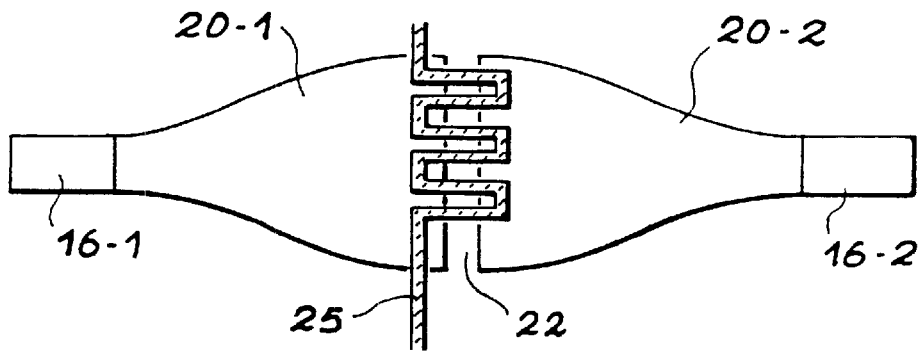
FIG._7
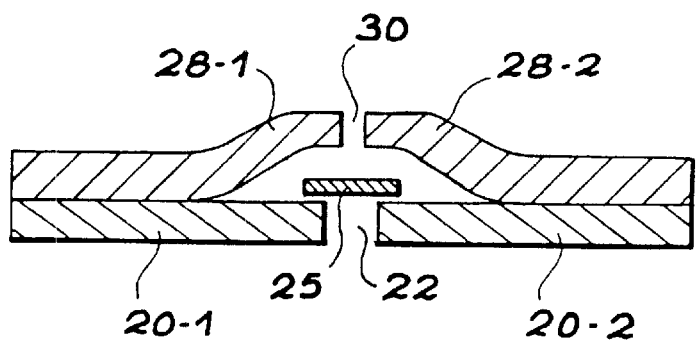
FIG._8

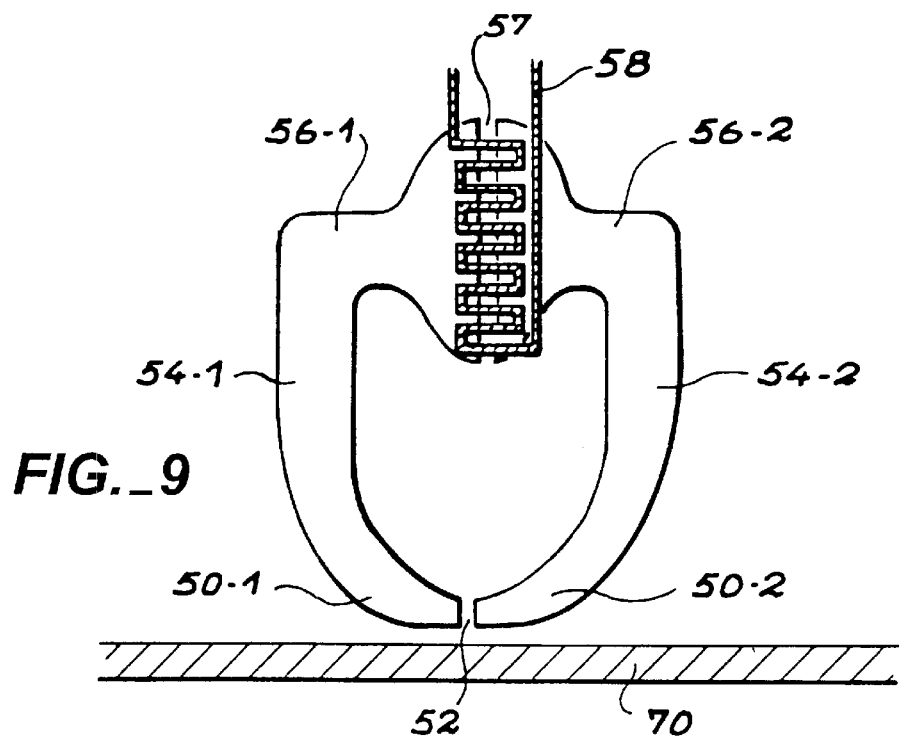
FIG._9
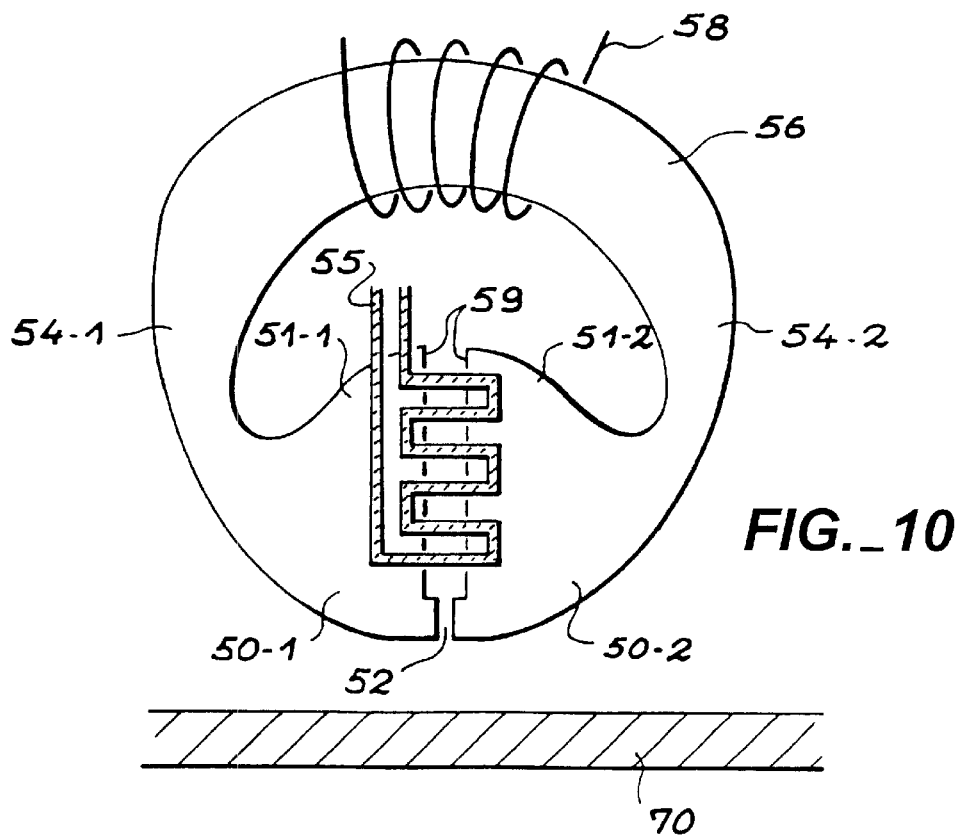
FIG._10

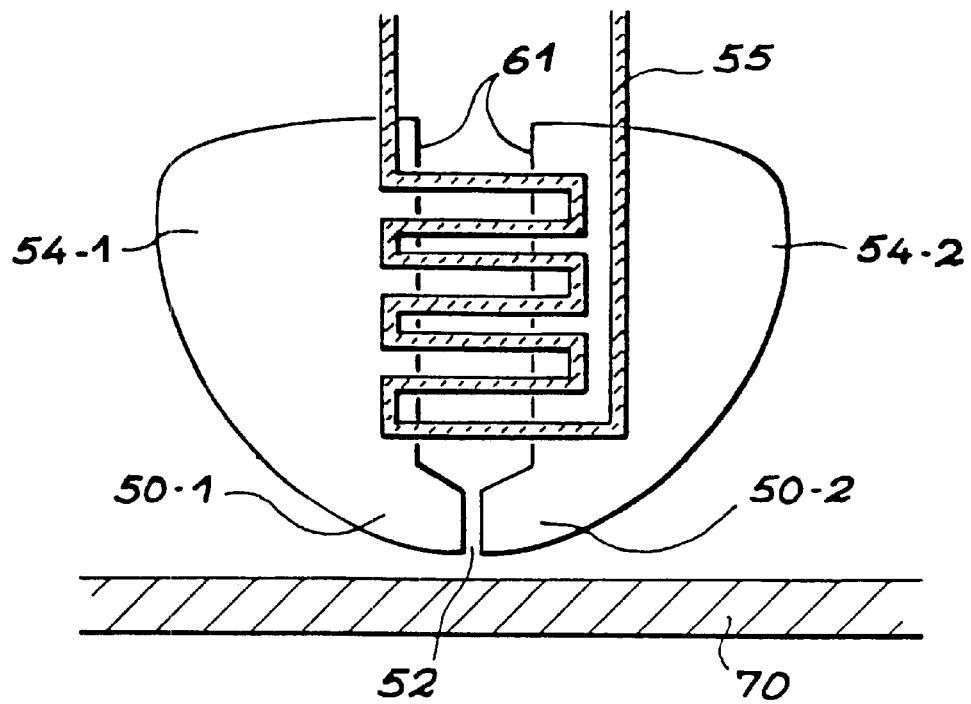
FIG._11
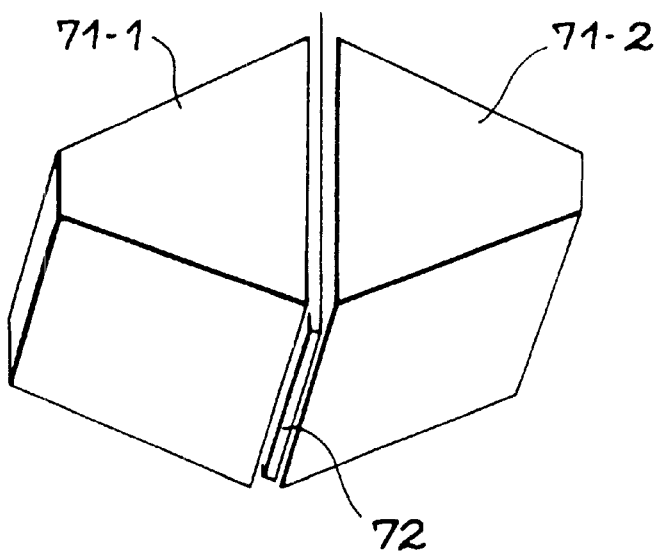
FIG._12

MAGNETIC FIELD SENSOR WITH MAGNETORESISTOR

DESCRIPTION

1. Technical Field

The purpose of this invention is a magnetic field sensor with magnetoresistance. Its applications are mainly for the measurement of weak fields, varying from about one nanotesla to a few milliteslas, and for magnetic recording particularly for reading.

2. State of Prior Art

A magnetic field sensor with magnetoresistance is a device that schematically comprises a magnetic circuit with a main air gap capable of detecting the field to be measured, and a secondary air gap (or read gap) associated with a magnetoresistance. (In some cases, the main air gap and the secondary air gap are coincident). The detected magnetic field is directed by the magnetic circuit and is coupled to the magnetoresistance in the secondary air gap. The value of the resistance of the magnetoresistance will depend on the field that passes through it, such that information about the detected magnetic field can be obtained by measuring this resistance.

This type of sensor can be made in different forms, and in particular comprises magnetic heads with thin layers, suitable for reading or writing. In a magnetic head with thin layers, the magnetic circuit is composed of one or several thin layers (typically of the order of a micron) made of a material with high permeability. A magnetic head with thin layers may have a horizontal structure when the thin layers plane is parallel to the recording medium (disk or tape) during operation, or a perpendicular structure in which case this plane is perpendicular to the recording medium. An inductive type of writing operation can be designed for each of these two types of head, by passing a current through a conducting coil surrounding the magnetic circuit.

The magnetoresistance that is used for reading will be denoted MR in the following, using a standard abbreviation in this technique.

FIG. 1 attached shows an example of a horizontal type of magnetic head with thin layers as described in document FR-A-2 712 420. This figure shows a substrate 10, a rear magnetic layer 12, two magnetic pillars 16-1, 16-2, two intermediate magnetic layers 20-1, 20-2 defining a secondary air gap 22, these layers 20-1, 20-2 becoming narrower towards the air gap 22 than towards the pillars 16-1, 16-2, and therefore forming field concentrators. One magnetoresistance 24 is located across the secondary air gap 22, a polarization conductor 26 being placed above it. Two polar parts 28-1, 28-2 define a main air gap 30. A conducting coil 18 surrounds the pillars 16-1, 16-2. This head is capable of relative movement with respect to a magnetic recording support 40.

Document FR-A-2 712 420 contains references to other types of horizontal magnetic heads with thin layers, in which the MR is placed close to the main air gap or close to an air gap formed in the rear magnetic layer.

Furthermore, the article by K. YAMADA entitled "Magnetoresistive Head for High Density Magnetic Recording" published in the "IEEE Translation Journal on Magnetics in Japan" review, vol. 8, No. Apr. 4, 1993, pp. 260–268 describes a vertical type of magnetic head which is illustrated in the attached FIG. 2. This shows a head comprising a magnetic circuit with two polar parts 50-1, 50-2 separated by a main air gap 52, two side arms 54-1, 54-2, and a rear closing part 56. Two secondary air gaps are formed in the side arms in which two MR 60-1, 60-2 are located.

The recording support 70 is placed facing the head, which is perpendicular to the said support.

There are simpler sensors composed of an MR placed between two magnetic screens, adjacent to these sensors in the form of a magnetic write/read head. The magnetic circuit is therefore reduced to these two screens.

The article by HIROTSUGU FUKUOKA et al. entitled "Effect of Magnetic Saturation on Reproducing Characteristics of Magnetoresistive Heads" published in "IEEE Transactions on Magnetics", vol. 30, No. Jul. 4, 1994, pp. 1345–1349, thus describes a sensor that is shown in the attached FIG. 3. This sensor comprises two magnetic screens 70-1, 70-2 and a magnetoresistance 72. A conductor 75 is placed flat on this magnetoresistance. The assembly moves in front of a recording support 80. In a way, the main air gap that detects the field from the support, is coincident with the secondary air gap containing the MR.

The article by R. YAMADA, mentioned above, also describes a similar device.

Magnetic sensors in which the MR is within the main air gap involve risks of the MR becoming saturated, which are even more severe with magnetic heads that operate in write and in read.

Furthermore, all these sensors according to prior art have some disadvantages. In magnetic heads like those described in FIG. 1, there are magnetic field leakages that weaken the measurement signal. These leakages also exist in devices like those shown in FIG. 2, and furthermore there is not much space in which to house the MR. With the sensors in FIG. 3, the MR is located too close to the recording support, resulting in accelerated wear, in addition to potential electrical breakdown problems. Furthermore, the size of the MR is limited by the size of the air gap, which itself depends on the density of information recorded on the support.

The purpose of this invention is to correct these disadvantages.

DESCRIPTION OF THE INVENTION

According to the invention, the magnetic circuit is made wider at the secondary air gap at the location of the MR, in order to minimize field losses (the active flux, in other words the flux crossing the MR, is maximum) while maximizing the available space to position the MR (which increases the signal and the signal-to-noise ratio). Saturation risks are thus also reduced due to the fact that the field is reduced due to the increased width at the secondary air gap. In the past, those who are skilled in the art would attempt to concentrate the magnetic field in the MR and therefore reduce the section of the magnetic circuit acting as a guide close to the read air gap in order to increase the flux at the sensor. This can be clearly seen in FIG. 1, described above, in which layers 20-1, 20-2 act as concentrators. Consequently, it also increased the reluctance of the magnetic circuit and the risks of the MR becoming saturated. In other words, an expert in the subject would attempt to increase the field level to increase the signal. The original concept for the invention is to increase the integration section while taking advantage of the fact that MRs include the signal in their volume. Therefore in the invention, the width of the magnetic circuit is increased at the read air gap.

More precisely, the purpose of this invention is a magnetic field sensor comprising a magnetic circuit with a main air gap through which the field to be detected can pass, this magnetic circuit being interrupted by at least one secondary air gap provided with a magnetoresistance, this sensor being characterized in that the magnetic circuit has a hollowed out shape on each side of the secondary air gap.

The sensor according to the invention may be in several shapes, for example either in the general form of the horizontal type of magnetic heads with thin layers, or in the general form of the vertical type of magnetic heads with thin layers, or in the form of magnetic screen sensors.

BRIEF DESCRIPTION OF THE FIGURES

FIG. 1, described above, shows a horizontal magnetic head with thin layers according to the state of the art, FIG. 2, described above, shows a vertical magnetic head according to the state of the art, FIG. 3, described above, shows a sensor composed of a magnetoresistance surrounded by two screens according to the state of the art, FIG. 4 is a sectional view illustrating a first embodiment of the invention corresponding to a horizontal type of magnetic head with thin layers, FIG. 5 shows a top view of the widened magnetic circuit at the secondary air gap, FIG. 6 shows a cross-sectional view of a variant of a horizontal magnetic head with thin layers, with hollowed out intermediate magnetic layers, FIG. 7 shows a top view of hollowed out intermediate magnetic layers, FIG. 8 shows a sectional view of another simple variant, FIG. 9 illustrates a second embodiment corresponding to a vertical magnetic head, FIG. 10 shows a variant of a vertical magnetic head with secondary air gap located immediately behind the main air gap, FIG. 11 shows another simplified variant, FIG. 12 shows another variant with magnetic screens.

DETAILED DESCRIPTION OF EMBODIMENTS OF THE INVENTION

According to a first embodiment illustrated in FIGS. 4 to 8, the sensor is in the general form of a horizontal magnetic head with thin layers. Firstly in FIG. 4, a sensor can be seen comprising a substrate 10, a rear magnetic layer, two magnetic pillars 16-1, 16-2, a front magnetic layer with two polar parts 28-1, 28-2 separated by a main air gap 30, as for the head illustrated in FIG. 1. The head moves in front of a recording support 40 parallel to the plane of the layers.

The sensor shown in FIG. 4 is innovative in that the magnetic layers 12-1 and 12-2 surrounding the secondary air gap 15 and its magnetoresistance 25, have a hollowed out shape as can be seen better in FIG. 5. This figure only shows parts 12-1 and 12-2, the secondary air gap 15 and the associated MR 25, for simplification purposes.

FIG. 6 shows another variant in which the head comprises two intermediate magnetic layers 20-1, 20-2 placed between the polar parts 28-1, 28-2 and the rear magnetic layer 12, these intermediate layers defining the secondary air gap 22 with the MR 25. The hollowed out shape of the layers 20-1, 20-2 is more clearly shown in FIG. 7 which is a top view.

In this variant, a conducting coil 19 can be wound around the rear layer 12, or an integrated solenoid type coil can be made. But this coil could also be placed around the magnetic pillars 16-1, 16-2 as for the head in FIG. 1.

FIG. 8 shows a very simple sensor, in which there is only a front magnetic layer with its two polar parts 28-1, 28-2 separated by the main air gap 30 and a rear magnetic layer formed by the two hollowed out parts 20-1, 20-2 separated by the secondary air gap 22. The hollowed out parts 20-1 and 20-2 in FIG. 8 may be of the shapes shown in FIG. 7.

According to a second embodiment illustrated in FIGS. 9, 10 and 11, the sensor is in the general form of a vertical magnetic head. FIG. 9 shows firstly a sensor comprising two polar parts 50-1, 50-2 surrounding a main air gap 52, two side arms 54-1, 54-2 that could be surrounded by a solenoid type coil, and a rear arm composed of two hollowed out parts 56-1, 56-2 on each side of a secondary air gap 57. The magnetoresistance 58 is coupled to this air gap. All magnetic parts may be obtained by deposition and etching of a magnetic layer, which is in a plane perpendicular to the recording support 70.

According to one variant of this embodiment, the secondary air gap is made in at least one of the side arms, the MR being coupled to this air gap. If each side arm comprises a secondary air gap, there will be an MR associated with each of these air gaps.

In the variant illustrated in FIG. 10, the rear arm 56 is in a single piece, and the side arms are extended by two hollowed out parts 51-1, 51-2 defining the secondary air gap 59. Therefore, this secondary air gap is located immediately behind the main air gap 52. The secondary air gap 59 is wider (the width being measured along the direction of relative displacement of support 70) than the main air gap 52.

In the case shown in FIG. 10, a conducting coil 58 may be wound around the closing arm 56.

FIG. 11 illustrates yet another variant in which the sensor only comprises two polar parts 50-1, 50-2, and two side arms 54-1, 54-2, the side arms having inside edges defining the secondary air gap 61.

Finally, FIG. 12 shows a sensor of the type comprising one MR surrounded by two magnetic screens. According to the invention, these screens 71-1, 71-2 have a hollowed out shape and the MR 72 is located between these screens.

Regardless of the embodiment, the magnetoresistance may be located in the secondary air gap, or on or under this air gap.

The magnetoresistance may work either in transverse mode or in longitudinal mode. It may also work on some parts in longitudinal mode and on other parts in transverse mode. This is the case for the variants illustrated in which the magnetoresistance is in the form of an orthogonal pattern of straight lines. The MR may also be in the shape of a parallelepiped (transverse mode).

The magnetoresistance may be composed of a single layer or a multi layer with giant effect.

What is claimed is:

1. A sensor with a horizontal magnetic head structure with a magnetic circuit comprising:

at least one front magnetic layer with two polar parts separated by a main air gap and a rear magnetic layer with two magnetic layers separated by a, secondary air gap, said rear magnetic layer being coupled to said front magnetic layer, said front and rear magnetic layers being located in parallel planes, the head being designed to cooperate with a magnetic recording support placed parallel to said planes, said secondary air gap being provided with a magnetoresistance, said two magnetic layers of said rear magnetic layer being enlarged on each side of said secondary air gap and diminishes in width with an increase in distance from said secondary air gap.

2. Sensor according to claim 1, in which the front magnetic layer and the rear magnetic layer are connected through two magnetic pillars.

3. Sensor according to claim 2, in which the secondary air gap interrupting the magnetic circuit is placed in the rear magnetic layer, which has two hollowed out parts on each side of the secondary air gap.

4. Sensor according to claim 1, in which the magnetic circuit is provided with a conducting coil.

5. Sensor according to claim 1, in which the magnetoresistance is placed above or below the secondary air gap.

6. Sensor according to claim 1, in which the magnetoresistance works in transverse mode.

7. Sensor according to claim 1, in which the magnetoresistance works in longitudinal mode.

8. Sensor according to claim 1, in which the magnetoresistance works on some parts in transverse mode and on other parts in longitudinal mode.

9. Sensor according to claim 8, in wich the magnetoresistance is in the form of an orthogonal pattern of straight lines.

10. A sensor with a horizontal magnetic head structure with a magnetic circuit comprising at least one front magnetic layer with two polar parts separated by a main air gap and a rear magnetic layer, in which the magnetic circuit also comprises two intermediate magnetic layers placed between the front magnetic layer and the rear magnetic layer, these two intermediate magnetic layers being separated from each other by a secondary air gap, these two intermediate magnetic layers being enlarged on each side of the secondary air gap and diminishing in width with an increase in distance from said secondary air gap.

11. A sensor with a vertical magnetic head structure, having a magnetic circuit comprising a magnetic layer located in a plane, the head being designed to cooperate with a magnetic recording support perpendicular to said plane, said magnetic circuit having two polar front parts surrounding a main air gap designed to cooperate with said magnetic recording support, two side arms and a rear arm composed of two parts surrounding a secondary air gap provided with a magnetoresistance, said two parts of said rear arm being enlarged on each side of said secondary air gap and becomes wider adjacent to said secondary air gap and diminishing in width with an increase in distance from said secondary air gap.

12. Sensor according to claim 11, in which the magnetic circuit is provided with at least one conducting coil.

13. A sensor with a vertical magnetic resistance head structure having a magnetic circuit comprising:

a magnetic layer locating in a plane, the head being designed to cooperate with a magnetic recording support perpendicular to said plane, said magnetic circuit having two polar front parts surrounding a main air gap designed to cooperate with said magnetic support;

a rear closing part; and two magnetic parts surrounding a secondary air gap provided with a magnetoresistance, said secondary air gap being located between said main gap and said secondary air gap, said two parts surrounding said secondary air gap being enlarged on each side of said secondary air gap and diminishes in width with an increase in distance from said secondary air gap.

* * * * *